US012595583B2

(12) United States Patent
Kang et al.

(10) Patent No.: US 12,595,583 B2
(45) Date of Patent: Apr. 7, 2026

(54) METHOD FOR PREPARING A P-TYPE ZrCoSb-BASED HALF-HEUSLER SINGLE CRYSTAL ALLOY WITH A CHEMICAL COMPOSITION OF ZrCoSb1-XSnX BY VERTICAL BRIDGMAN DIRECTIONAL CRYSTALLIZATION

(71) Applicants: Dalian University of Technology, Dalian City (CN); NingBo Inst. of Dalian University of Technology, Ningbo City (CN)

(72) Inventors: Huijun Kang, Dalian City (CN); Rongchun Chen, Dalian City (CN); Tongmin Wang, Dalian City (CN); Enyu Guo, Dalian City (CN); Zongning Chen, Dalian City (CN); Tingju Li, Dalian City (CN); Zhiqiang Cao, Dalian City (CN); Yiping Lu, Dalian City (CN); Jinchuan Jie, Dalian City (CN); Yubo Zhang, Dalian City (CN)

(73) Assignees: Dalian University of Technology, Dalian City (CN); NingBo Inst. of Dalian University of Technology, Ningbo City (CN)

( * ) Notice: Subject to any disclaimer, the term of this patent is extended or adjusted under 35 U.S.C. 154(b) by 263 days.

(21) Appl. No.: 18/380,453

(22) Filed: Oct. 16, 2023

(65) Prior Publication Data

US 2024/0401225 A1 Dec. 5, 2024

(30) Foreign Application Priority Data

May 31, 2023 (CN) .......................... 202310636461.7

(51) Int. Cl.
| | |
|---|---|
| C30B 11/02 | (2006.01) |
| C30B 11/00 | (2006.01) |
| C30B 29/52 | (2006.01) |

(52) U.S. Cl.
CPC ............ *C30B 11/02* (2013.01); *C30B 11/006* (2013.01); *C30B 29/52* (2013.01)

(58) Field of Classification Search
CPC .... C30B 9/00; C30B 9/04; C30B 9/06; C30B 11/00; C30B 11/003; C30B 11/006;
(Continued)

(56) References Cited

U.S. PATENT DOCUMENTS 3,287,108 A * 11/1966 Hausner ................ C30B 11/003
118/724
2003/0154911 A1* 8/2003 Eissler .................... C30B 29/30
117/83
(Continued)

OTHER PUBLICATIONS

Sekimoto, et al. publication entitled "High-thermoelectric figure of merit realized in p-type half-Heusler compounds: ZrCoSnxSb1-x," Japanese Journal of Applied Physics, vol. 46, No. 27, pp. L673-L75 (2007). (Year: 2007).*

*Primary Examiner* — Kenneth A Bratland, Jr.
(74) *Attorney, Agent, or Firm* — Weiss & Moy, PC; Jeffrey D. Moy

(57) ABSTRACT

Provided are a P-type ZrCoSb-based half-Heusler single crystal alloy and a preparation method thereof. The method for preparing the P-type ZrCoSb-based half-Heusler single crystal alloy includes: subjecting alloy raw materials to smelting under a first protective atmosphere to obtain a half-Heusler polycrystalline alloy ingot, the alloy raw materials corresponding to a chemical composition of the P-type ZrCoSb-based half-Heusler single crystal alloy; and subjecting the half-Heusler polycrystalline alloy ingot to vertical Bridgman directional crystallization under a second protec-
(Continued)

tive atmosphere to obtain the P-type ZrCoSb-based half-Heusler single crystal alloy. The P-type ZrCoSb-based half-Heusler single crystal alloy has the chemical composition of $ZrCoSb_{1-x}Sn_x$, x in the $ZrCoSb_{1-x}Sn_x$ being in a range of $0.1 \leq x \leq 0.3$; and the P-type ZrCoSb-based half-Heusler single crystal alloy has an MgAgAs-type crystal structure.

8 Claims, 5 Drawing Sheets

(58) Field of Classification Search
CPC ......... C30B 11/02; C30B 29/00; C30B 29/10; C30B 29/52
USPC ................... 117/11, 73, 77, 81–82, 937, 939
See application file for complete search history.

(56) References Cited

U.S. PATENT DOCUMENTS

2011/0179992 A1* 7/2011 Schwerdtfeger, Jr. ....................... C30B 11/003
117/81
2011/0253033 A1* 10/2011 Dhanaraj ................ C30B 29/12
117/223
2016/0256923 A1* 9/2016 Liu ........................ H01F 1/0308
2021/0175377 A1* 6/2021 Shetty ................... H10F 10/144

* cited by examiner

METHOD FOR PREPARING A P-TYPE ZrCoSb-BASED HALF-HEUSLER SINGLE CRYSTAL ALLOY WITH A CHEMICAL COMPOSITION OF ZrCoSb1-XSnX BY VERTICAL BRIDGMAN DIRECTIONAL CRYSTALLIZATION

CROSS REFERENCE TO RELATED APPLICATION

This application claims the benefit and priority of Chinese Patent Application No. 2023106364617, entitled "P-type ZrCoSb-based half-Heusler single crystal alloy and preparation method thereof" filed with the China National Intellectual Property Administration on May 31, 2023, the disclosure of which is incorporated by reference herein in its entirety as part of the present application.

TECHNICAL FIELD

The present disclosure relates to a technical field, in particular to a P-type ZrCoSb-based half-Heusler single crystal alloy and a preparation method thereof.

BACKGROUND

ZrCoSb-based half-Heusler alloy, as an excellent medium-high temperature thermoelectric alloy, has been greatly developed and optimized for its thermoelectric properties. However, compared with N-type ZrCoSb-based alloys, P-type ZrCoSb-based alloys have a lower carrier mobility, which hinders the further optimization of its thermoelectric properties. For polycrystalline thermoelectric alloys, the grain boundary is one of the main carrier scattering centers. Although researchers optimize the carrier mobility through a series of control strategy, most of these researches are based on polycrystalline alloys.

SUMMARY

In view of this, the present disclosure provides a P-type half-Heusler single crystal alloy and a preparation method thereof. The P-type half-Heusler single crystal alloy according to the present disclosure has excellent electrical transport properties.

To achieve the above object, the present disclosure provides a P-type ZrCoSb-based half-Heusler single crystal alloy, wherein the P-type ZrCoSb-based half-Heusler single crystal alloy has a chemical composition of $ZrCoSb_{1-x}Sn_x$, x in the $ZrCoSb_{1-x}Sn_x$ being in a range of $0.1 \leq x \leq 0.3$; and the P-type ZrCoSb-based half-Heusler single crystal alloy has an MgAgAs-type crystal structure.

In some embodiments, the x is selected from the group consisting of 0.16, 0.20, and 0.24.

The present disclosure further provides a method for preparing the P-type ZrCoSb-based half-Heusler single crystal alloy as described above, which includes:

subjecting alloy raw materials to smelting under a first protective atmosphere to obtain a half-Heusler polycrystalline alloy ingot, the alloy raw materials corresponding to the chemical composition of the P-type ZrCoSb-based half-Heusler single crystal alloy; and subjecting the half-Heusler polycrystalline alloy ingot to vertical Bridgman directional crystallization under a second protective atmosphere to obtain the P-type ZrCoSb-based half-Heusler single crystal alloy.

In some embodiments, smelting is performed by magnetic levitation smelting, which includes: heating the alloy raw materials to obtain a melt in a molten state and holding the melt in the molten state for 30 s to 45 s; the smelting is performed 3 to 5 times.

In some embodiments, the vertical Bridgman directional crystallization is performed by a process including:

placing the half-Heusler polycrystalline alloy ingot into a crucible, melting the half-Heusler polycrystalline alloy ingot by heating to a material melting temperature under the second protective atmosphere, to obtain a molten alloy material in the crucible; and subjecting the molten alloy material to directional crystallization by taking the crucible as a reference and raising a heating furnace cavity along the crucible;

wherein raising a heating furnace cavity along the crucible is conducted at a rate of 0.3 mm/h to 2 mm/h.

In some embodiments, heating to the material melting temperature is performed by:

heating to a first temperature at a first heating rate, and then heating to the material melting temperature at a second heating rate;

wherein the first heating rate is in a range of 10° C./min to 15° C./min, and the first temperature is 1,000° C.; and the second heating rate is in a range of 2° C./min to 5° C./min, and the material melting temperature is in a range of 1,560° C. to 1,600° C.

In some embodiments, the method as described in the above solutions further includes holding a resulting material obtained after heating to a material melting temperature at the material melting temperature for 3 h to 6 h.

In some embodiments, during subjecting the molten alloy material to directional crystallization, the crucible is cooled from the material melting temperature to a temperature of 1,510° C. to 1,550° C. at a rate of 2° C./min to 5° C./min.

In some embodiments, the vertical Bridgman directional crystallization is conducted at a pressure of 112,000 Pa to 130,000 Pa.

In some embodiments, the method as described in the above technical solutions further includes cooling a product obtained after the vertical Bridgman directional crystallization, wherein the cooling is performed by:

cooling to a first cooling temperature at a first cooling rate, and then cooling to ambient temperature at a second cooling rate;

wherein the first cooling rate is in a range of 2° C./min to 5° C./min, and the first cooling temperature is in a range of 1,000° C. to 1,200° C.; and the second cooling rate is in a range of 10° C./min to 25° C./min.

The present disclosure provides a P-type ZrCoSb-based half-Heusler single crystal alloy. The P-type ZrCoSb-based half-Heusler single crystal alloy has a chemical composition of $ZrCoSb_{1-x}Sn_x$, x in the $ZrCoSb_{1-x}Sn_x$ being in a range of $0.1 \leq x \leq 0.3$; the P-type ZrCoSb-based half-Heusler single crystal alloy has an MgAgAs-type crystal structure. In the present disclosure, additional holes are introduced by doping an Sn at an Sb site, so as to increase the concentration of carriers. Furthermore, the P-type $ZrCoSb_{1-x}Sn_x$ single crystal alloy according to the present disclosure eliminates a negative effect of grain boundaries on carrier transport. Based on the optimization of carrier mobility and carrier concentration, the optimization of electrical transport properties is realized, such as electrical conductivity, Seebeck coefficient, and power factor.

DETAILED DESCRIPTION OF THE EMBODIMENTS

Figure 1:
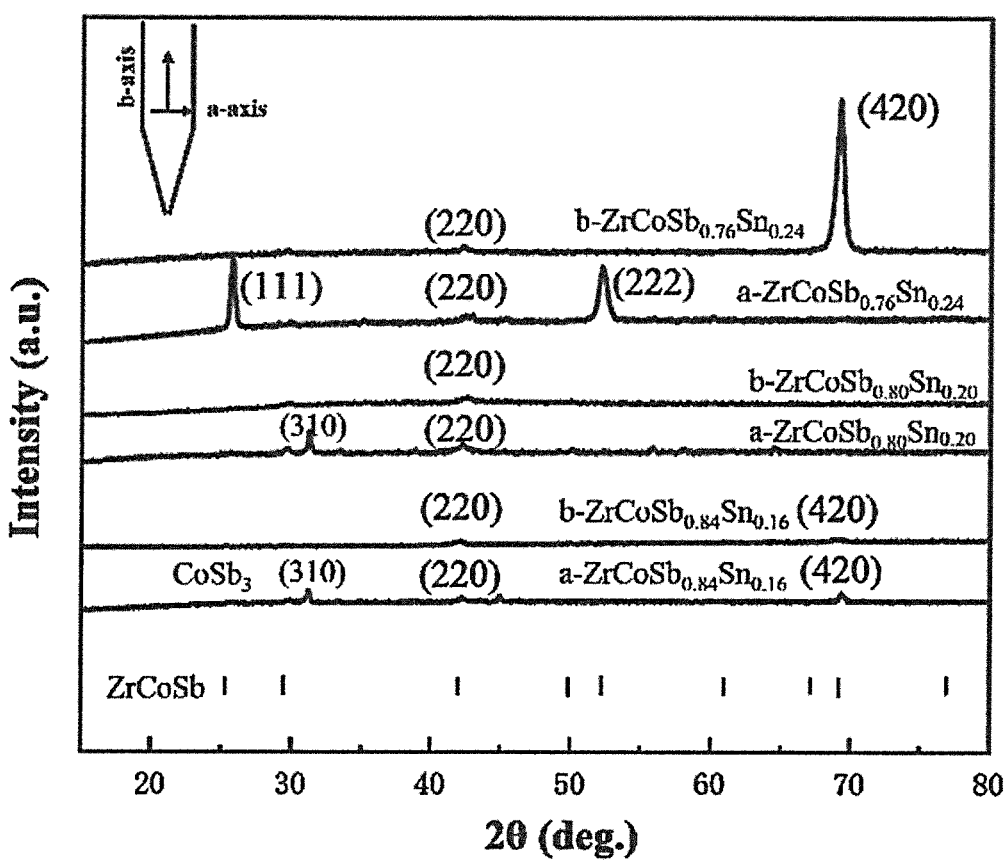
FIG. 1 shows X-ray diffraction (XRD) pattern of the ZrCoSb-based half-Heusler single crystal alloys prepared in Examples 1 to 3.

The present disclosure provides a P-type ZrCoSb-based half-Heusler single crystal alloy, wherein the P-type ZrCoSb-based half-Heusler single crystal alloy has a chemical composition of $ZrCoSb_{1-x}Sn_x$, x in the $ZrCoSb_{1-x}Sn_x$ being in a range of $0.1 \leq x \leq 0.3$; and the P-type ZrCoSb-based half-Heusler single crystal alloy has an MgAgAs-type crystal structure.

In some embodiments, the x in the $ZrCoSb_{1-x}Sn_x$ is in a range of $0 \leq x \leq 0.25$, preferably $0.15 \leq x \leq 0.25$, and more preferably 0.16, 0.20, or 0.24.

In some embodiments, the P-type ZrCoSb-based half-Heusler single crystal alloy has an MgAgAs-type crystal structure, and a space group of F-43m.

The present disclosure further provides a method for preparing the P-type ZrCoSb-based half-Heusler single crystal alloy as described above, which includes the following steps:

subjecting alloy raw materials to smelting under a first protective atmosphere to obtain a half-Heusler polycrystalline alloy ingot, the alloy raw materials corresponding to the chemical composition of the P-type ZrCoSb-based half-Heusler single crystal alloy; and subjecting the half-Heusler polycrystalline alloy ingot to vertical Bridgman directional crystallization under a second protective atmosphere to obtain the P-type ZrCoSb-based half-Heusler single crystal alloy.

In some embodiments, the alloy raw materials include Zr particles, Co particles, Sb particles, and Sn particles. The Zr particles, the Co particles, the Sb particles, and the Sn particles have particle sizes of $\varphi 2 \times 3$ mm, $\varphi 3 \times 3$ mm, 2 mm to 6 mm (spherical), and $\varphi 2 \times 5$ mm, respectively. The Zr particles, the Co particles, the Sb particles, and the Sn particles have purities of 99.5%, 99.95%, 99.99%, and 99.95%, respectively.

In some embodiments, the smelting is performed by magnetic levitation smelting. In some embodiments, the smelting includes: heating the alloy raw materials to obtain a melt in a molten state and holding the melt in the molten state for 30 s to 45 s, preferably 40 s. In some embodiments, the protective atmosphere is provided by high-purity argon, and the high-purity argon has a purity of greater than or equal to 99.99%. In some embodiments, the smelting is conducted more than or equal to 3 to 5 times, preferably 3 to 4 times. In some embodiments, the smelting is conducted in a magnetic levitation induction furnace.

In some embodiments, after the half-Heusler polycrystalline alloy ingot is obtained, the method further comprises crushing the half-Heusler polycrystalline alloy ingot before conducting the vertical Bridgman directional crystallization.

In some embodiments, the crushing is performed such that the half-Heusler polycrystalline alloy ingot has a thickness of about 1 mm. There is no special limitation on the specific implementation of crushing, and operations well-known to those skilled in the art may be used.

In some embodiments, the half-Heusler polycrystalline alloy ingot is subjected to vertical Bridgman directional crystallization under a second protective atmosphere to obtain the P-type ZrCoSb-based half-Heusler single crystal alloy.

In some embodiments, the vertical Bridgman directional crystallization is performed by a process including the following steps:

placing the half-Heusler polycrystalline alloy ingot into a crucible, melting the half-Heusler polycrystalline alloy ingot by heating to a material melting temperature under the second protective atmosphere, to obtain a molten alloy material in the crucible; and subjecting the molten alloy material to directional crystallization by taking the crucible as a reference and raising a heating furnace cavity along the crucible.

In some embodiments, the half-Heusler polycrystalline alloy ingot is placed into the crucible, and heated to a material melting temperature under the second protective atmosphere so as to melt the half-Heusler polycrystalline alloy ingot to obtain the molten alloy material in the crucible.

In some embodiments, heating to the material melting temperature is performed by:

heating to a first temperature at a first heating rate, and then heating to the material melting temperature at a second heating rate.

In some embodiments, the first heating rate is in a range of 10° C./min to 15° C./min, preferably 12° C./min, and the first temperature is 1,000° C.

In some embodiments, the second heating rate is in a range of 2° C./min to 5° C./min, preferably 3° C./min to 4° C./min, and the material melting temperature is in a range of 1,560° C. to 1,600° C. In some embodiments, a resulting material obtained after heating to the material melting temperature is held at the material melting temperature for 3 h to 6 h, preferably 4 h.

In some embodiments, after the molten alloy material is obtained, it is subjected to directional crystallization by taking the crucible as a reference and raising a heating furnace cavity along the crucible.

In some embodiments, the crucible is a graphite crucible with a conical bottom, and the conical bottom has a cone angle of 25° to 35°, preferably 30°.

In some embodiments, the vertical Bridgman directional crystallization is conducted at a pressure of 120,000 Pa to 130,000 Pa, preferably 125,000 Pa. In some embodiments, the crystallization furnace cavity is raised at a rate of 0.3 mm/h to 2 mm/h, preferably 0.5 mm/h.

In some embodiments, during subjecting the molten alloy material to directional crystallization, the crucible is cooled from the material melting temperature to a temperature of 1,510° C. to 1,550° C. at a rate of 2° C./min to 5° C./min, preferably from the material melting temperature to a temperature of 1,550° C. at a rate of 3° C./min.

In some embodiments, the half-Heusler polycrystalline alloy ingot is subjected to vertical Bridgman directional crystallization such that under the premise of seedlesscrystal induction growth, nucleation and development are driven by undercooling, and single crystals are then gradually grown through crystal competition and elimination. The corresponding small-angle design of the crucible enables the crystal elimination to be accelerated.

In some embodiments, the method further comprises cooling a resulting product after conducting the vertical Bridgman directional crystallization.

In some embodiments, the cooling is conducted by: cooling to a first cooling temperature at a first cooling rate, and then cooling to room temperature at a second cooling rate.

In some embodiments, the first cooling rate is in a range of 2/min to 5/min, preferably 3° C./min, and the first cooling temperature is in a range of 1,000° C. to 1,200° C., preferably 1,100° C.; the second cooling rate is in a range of 10° C./min to 25° C./min, preferably 15° C./min.

The technical solutions of the present disclosure will be clearly and completely described below with reference to the examples of the present disclosure. Apparently, the described examples are merely a part rather than all of the examples of the present disclosure. All other examples obtained by those skilled in the art based on the examples of the present disclosure without creative efforts shall fall within the scope of the present disclosure.

Example 1

Preparation of $ZrCoSb_{0.84}Sn_{0.16}$:

Zr, Co, Sb, and Sn particles corresponding to the chemical composition of $ZrCoSb_{0.84}Sn_{0.16}$ were used as raw materials, and an additional 2% of Sb was added.

The above raw materials were placed into a magnetic levitation induction furnace and subjected to levitation smelting, obtaining a melt in a molten state. The melt was then held in the molten state for 35 s. The previous process was repeated 3 times to obtain a P-type $ZrCoSb_{0.84}Sn_{0.16}$ half-Heusler polycrystalline alloy. After that, the half-Heusler polycrystalline alloy was crushed, placed into a graphite crucible with a conical bottom having a cone angle of 25°, heated to a temperature of 1,000° C. at a rate of 15° C./min, and then heated to a temperature of 1,600° C. at a rate of 5° C./min and then held at 1,600° C. for 6 h. After that, the graphite crucible was cooled to 1,550° C., and a heating furnace cavity was raised along the graphite crucible at a rate of 0.5 mm/h, during which time single crystals grew at a rate of 0.5 mm/h. After the growth was completed, a resulting product was cooled to a temperature of 1,200° C. at a rate of 3° C./min, and then to room temperature at a rate of 15° C./min; during the whole process of the single crystals growth, a pressure in the crystallization furnace was kept at 120,000 Pa by feeding high-purity argon gas.

Example 2

This example was performed as described in Example 1, except that $ZrCoSb_{0.84}Sn_{0.16}$ was replaced by $ZrCoSb_{0.80}Sn_{0.20}$.

Example 3

This example was performed as described in Example 1, except that $ZrCoSb_{0.84}Sn_{0.16}$ was replaced by $ZrCoSb_{0.76}Sn_{0.24}$.

FIG. 1 shows XRD patterns of the ZrCoSb-based half-Heusler single crystal alloys prepared in Examples 1 to 3. As shown in FIG. 1: except for a $CoSb_3$ impurity phase caused by the additional Sb element, the other peaks of the $ZrCoSb_{1-x}Sn_x$ single crystal alloys correspond to that in a standard PDF card of the ZrCoSb alloy. In addition, except $ZrCoSb_{0.76}Sn_{0.24}$ along the a-axis direction is a highly oriented half-Heusler polycrystalline alloy, other alloys along the a- or b-axis are all (120)-oriented single crystal alloys.

Figure 2:
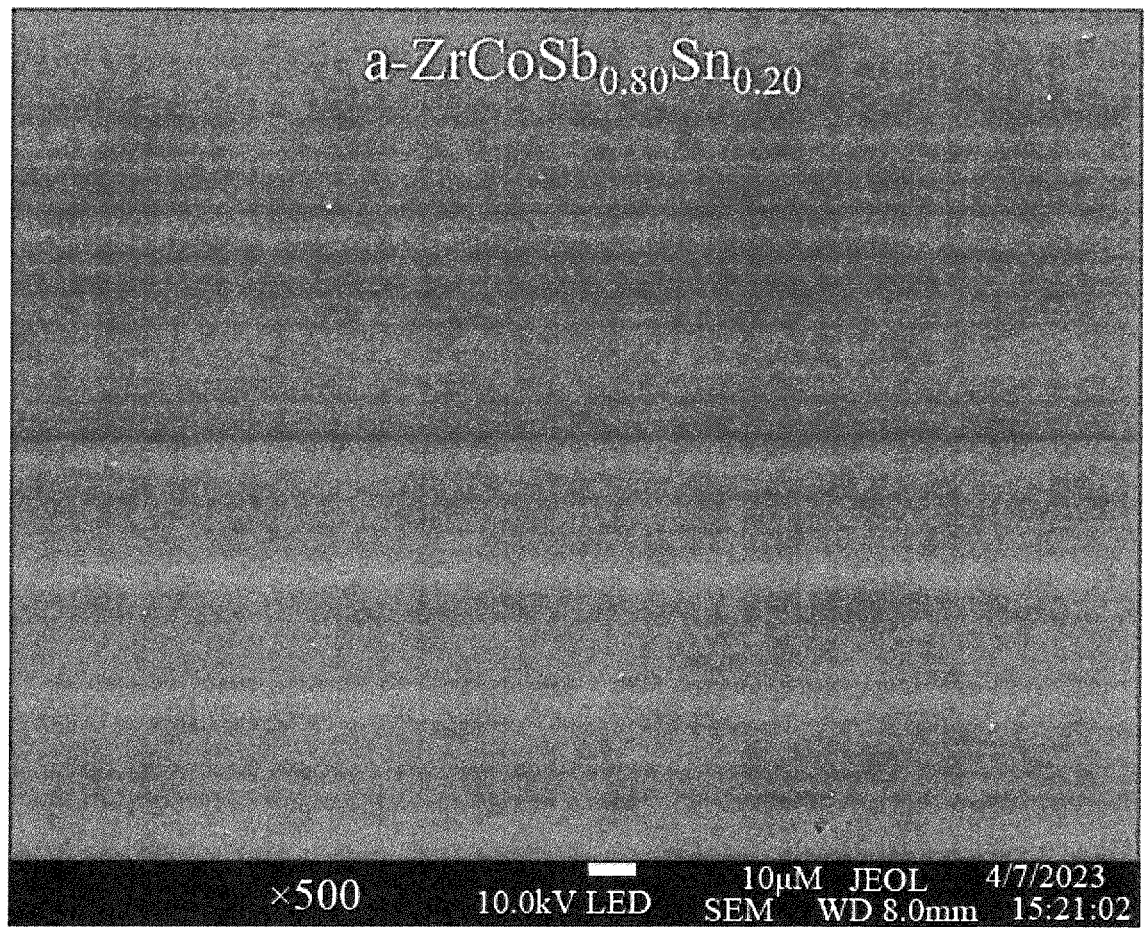
FIG. 2 shows a scanning electron microscopy (SEM) image of the ZrCoSb-based half-Heusler single crystal alloy prepared in Example 2.

FIG. 2 shows an SEM image of the ZrCoSb-based half-Heusler single crystal alloy prepared in Example 2. As shown in FIG. 2: the ZrCoSb-based half-Heusler single crystal alloy has no grain boundaries; moreover, a surface of the ZrCoSb-based half-Heusler single crystal alloy prepared in Example 2 is clean without obvious holes.

Figure 3:
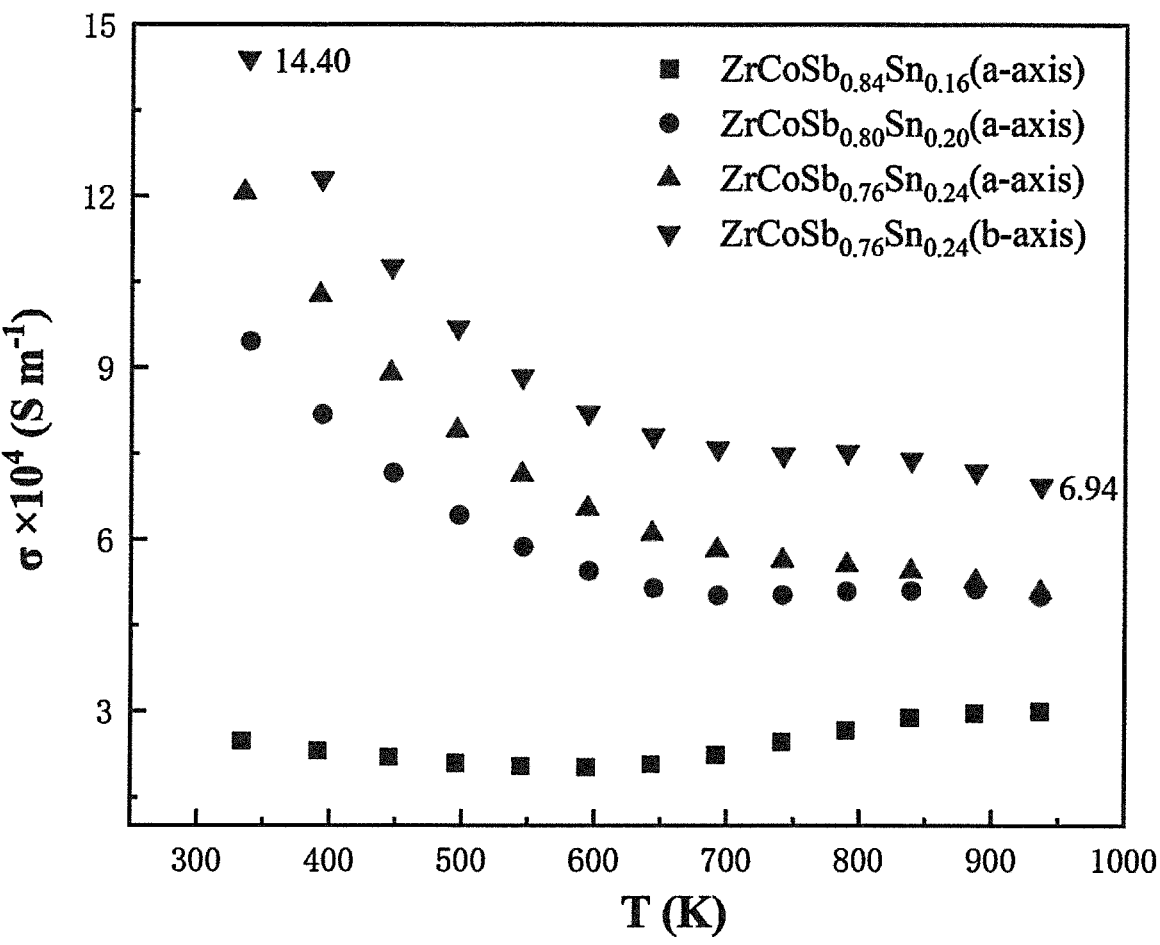
FIG. 3 shows electrical conductivity of the ZrCoSb-based half-Heusler single crystal alloys prepared in Examples 1 to 3.

In the present disclosure, electrical property tests were conducted on the ZrCoSb-based half-Heusler single crystal alloys prepared in Examples 1 to 3. FIG. 3 shows electrical conductivity of the ZrCoSb-based half-Heusler single crystal alloys prepared in Examples 1 to 3. As shown in FIG. 3, with the increase of Sn doping content, the electrical conductivity increases gradually. For $ZrCoSb_{0.76}Sn_{0.24}$ alloy, the electrical conductivity along the b-axis is higher than that along the a-axis. Under the premise that the doping content of the acceptor element (Sn) is constant, the increase of the conductivity in the b-axis direction is mainly due to the stronger orientation of the b-axis.

Figure 4:
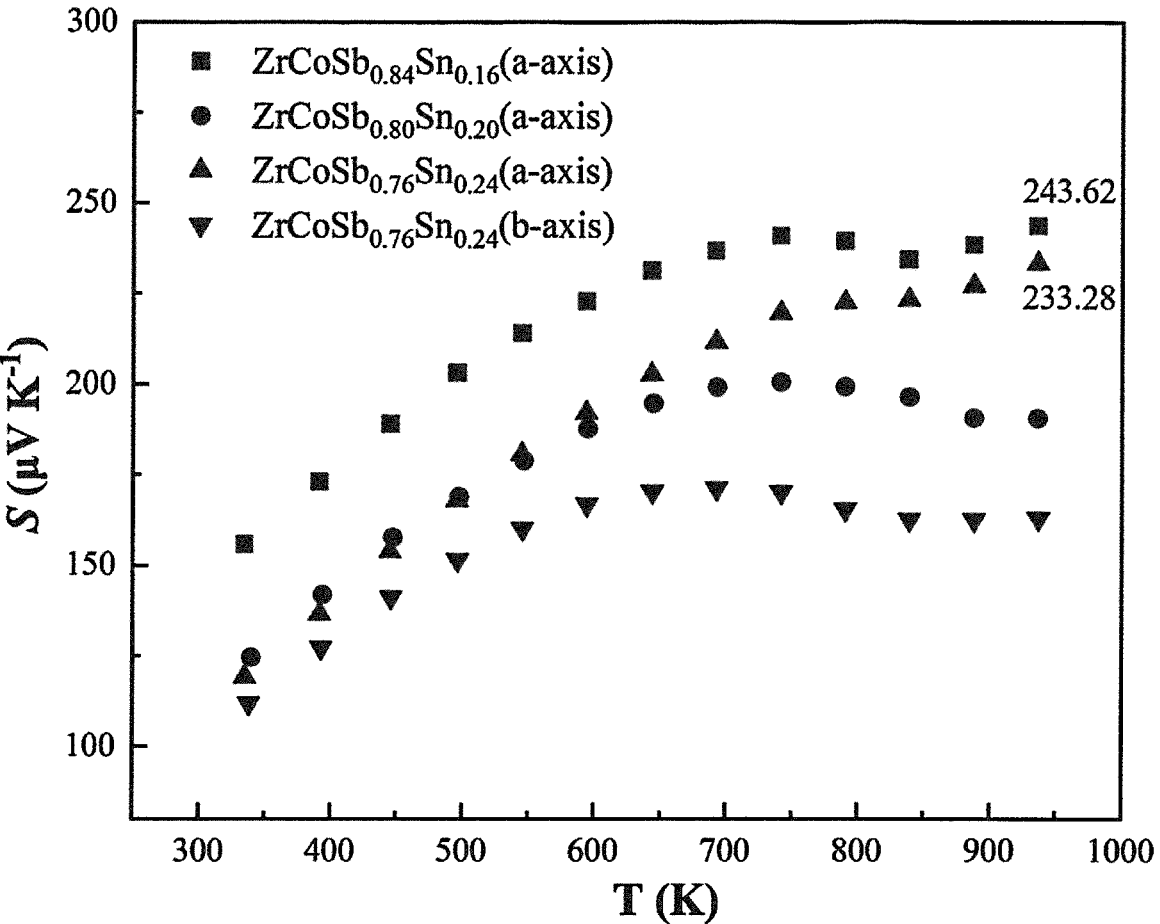
FIG. 4 shows Seebeck coefficient of the ZrCoSb-based half-Heusler single crystal alloys prepared in Examples 1 to 3.

FIG. 4 shows Seebeck coefficient of the ZrCoSb-based half-Heusler single crystal alloys prepared in Examples 1 to 3. As shown in FIG. 4, based on a coupling effect with the carrier concentration, the Seebeck coefficient decreases with the increase of the doping content of Sn. For the $ZrCoSb_{0.76}Sn_{0.24}$ alloy, although the b-axis direction shows a higher electrical conductivity, the Seebeck coefficient in the b-axis direction is generally lower than that in the a-axis direction.

Figure 5:
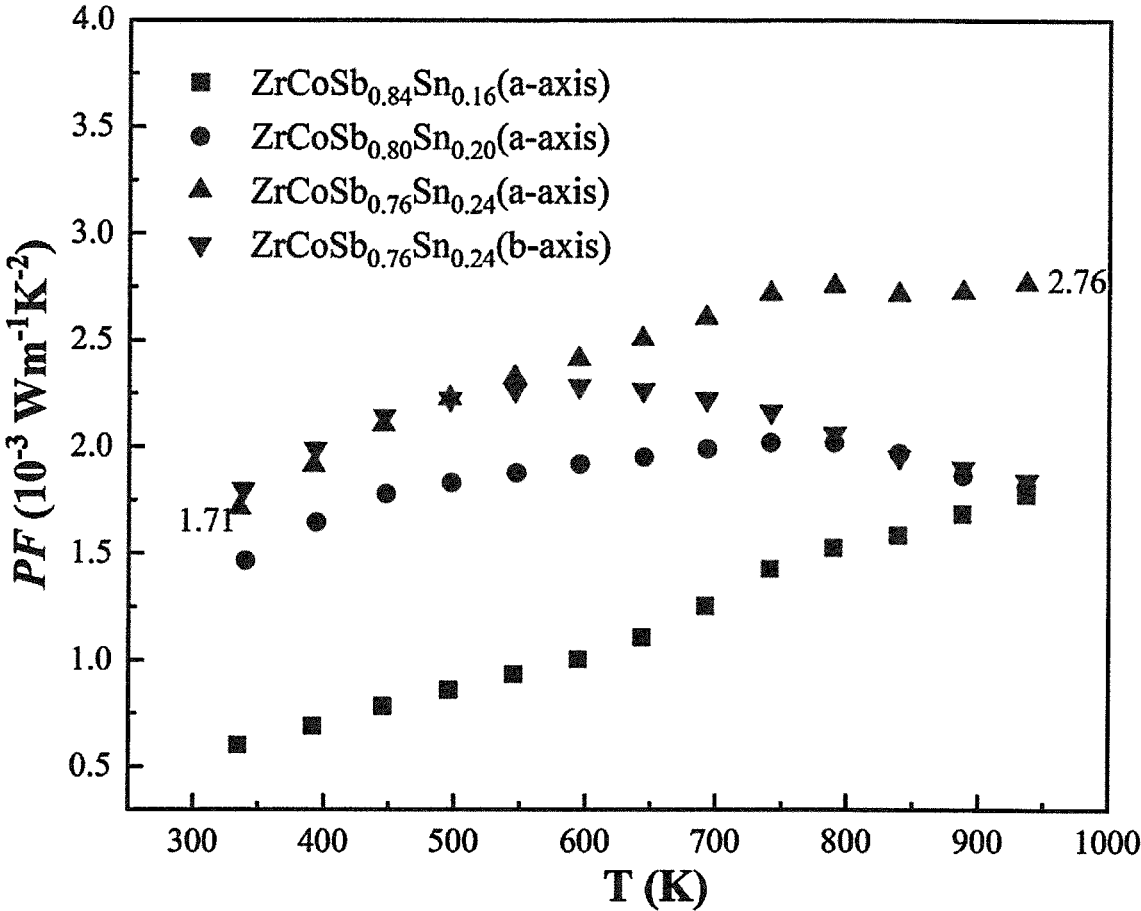
FIG. 5 shows power factor of the ZrCoSb-based half-Heusler single crystal alloys prepared in Examples 1 to 3.

FIG. 5 shows power factor calculated from the ZrCoSb-based half-Heusler single crystal alloys of Examples 1 to 3. As shown in FIG. 5, based on coordinated regulation of the electrical conductivity and Seebeck coefficient, the P-type $ZrCoSb_{0.76}Sn_{0.24}$ single crystal alloy has a higher power factor in the a-axis direction.

The above descriptions are merely preferred embodiments of the present disclosure. It should be noted that a person of ordinary skill in the art may further make several improvements and modifications without departing from the principle of the present disclosure, and such improvements and modifications should be deemed as falling within the scope of the present disclosure.

What is claimed is:

1. A method for preparing a P-type ZrCoSb-based half-Heusler single crystal alloy, comprising:
    subjecting alloy raw materials to smelting under a first protective atmosphere to obtain a half-Heusler polycrystalline alloy ingot, the alloy raw materials corresponding to a chemical composition of the P-type ZrCoSb-based half-Heusler single crystal alloy; and
    subjecting the half-Heusler polycrystalline alloy ingot to vertical Bridgman directional crystallization under a second protective atmosphere to obtain the P-type ZrCoSb-based half-Heusler single crystal alloy; wherein
    the P-type ZrCoSb-based half-Heusler single crystal alloy has a chemical composition of $ZrCoSb_{1-x}Sn_x$, x in the $ZrCoSb_{1-x}Sn_x$ being in a range of $0.20 \leq x \leq 0.3$;
    the P-type ZrCoSb-based half-Heusler single crystal alloy has an MgAgAs-type crystal structure;
    the vertical Bridgman directional crystallization is conducted at a pressure of 112,000 Pa to 130,000 Pa; and the vertical Bridgman directional crystallization is performed by a process comprising:

placing the half-Heusler polycrystalline alloy ingot into a crucible;

melting the half-Heusler polycrystalline alloy ingot by heating to a material melting temperature under the second protective atmosphere, to obtain a molten alloy material in the crucible; and subjecting the molten alloy material to directional crystallization by taking the crucible as a reference and raising a heating furnace cavity along the crucible, wherein raising the heating furnace cavity along the crucible is conducted at a rate of 0.3 mm/h to 2 mm/h; and heating to the material melting temperature is performed by:

heating to a first temperature at a first heating rate; and heating to the material melting temperature at a second heating rate;

wherein the first heating rate is in a range of 10° C./min to 15° C./min, and the first temperature is 1,000° C.; and the second heating rate is in a range of 2° C./min to 5° C./min, and the material melting temperature is in a range of 1,560° C. to 1,600° C.

2. The method of claim 1, wherein the smelting is performed by magnetic levitation smelting comprising heating the alloy raw materials to obtain a melt in a molten state, and holding the melt in the molten state for 30 s to 45 s; and the smelting is performed 3 to 5 times.

3. The method of claim 1, further comprising holding the molten alloy material after heating to the material melting temperature at the material melting temperature for 3 h to 6 h.

4. The method of claim 1, wherein during subjecting the molten alloy material to directional crystallization, the crucible is cooled from the material melting temperature to a temperature of 1,510° C. to 1,550° C. at a rate of 2° C./min to 5° C./min.

5. The method of claim 1, further comprising cooling the P-type ZrCoSb-based half-Heusler single crystal alloy obtained after the vertical Bridgman directional crystallization, wherein the cooling is performed by:

cooling to a first cooling temperature at a first cooling rate, and cooling to ambient temperature at a second cooling rate;

wherein the first cooling rate is in a range of 2° C./min to 5° C./min, and the first cooling temperature is in a range of 1,000° C. to 1,200° C.; and the second cooling rate is in a range of 10° C./min to 25° C./min.

6. The method of claim 1, wherein the x is selected from the group consisting of 0.20 and 0.24.

7. The method of claim 1, wherein the crucible is a graphite crucible with a conical bottom, and the conical bottom has a cone angle of 25° to 35°.

8. A method for preparing a P-type ZrCoSb-based half-Heusler single crystal alloy, comprising:

subjecting alloy raw materials to smelting under a first protective atmosphere to obtain a half-Heusler polycrystalline alloy ingot, the alloy raw materials corresponding to a chemical composition of the P-type ZrCoSb-based half-Heusler single crystal alloy; and subjecting the half-Heusler polycrystalline alloy ingot to vertical Bridgman directional crystallization under a second protective atmosphere to obtain the P-type ZrCoSb-based half-Heusler single crystal alloy; wherein the P-type ZrCoSb-based half-Heusler single crystal alloy has a chemical composition of $ZrCoSb_{1-x}Sn_x$, x in the $ZrCoSb_{1-x}Sn_x$ being in a range of $0.20 \leq x \leq 0.3$;

the P-type ZrCoSb-based half-Heusler single crystal alloy has an MgAgAs-type crystal structure;

the vertical Bridgman directional crystallization is conducted at a pressure of 112,000 Pa to 130,000 Pa; and the vertical Bridgman directional crystallization is performed by a process consisting of:

placing the half-Heusler polycrystalline alloy ingot into a crucible;

melting the half-Heusler polycrystalline alloy ingot by heating to a material melting temperature under the second protective atmosphere, to obtain a molten alloy material in the crucible; and subjecting the molten alloy material to directional crystallization by taking the crucible as a reference and raising a heating furnace cavity along the crucible, wherein raising the heating furnace cavity along the crucible is conducted at a rate of 0.3 mm/h to 2 mm/h; and heating to the material melting temperature is performed by:

heating to a first temperature at a first heating rate; and heating to the material melting temperature at a second heating rate;

wherein the first heating rate is in a range of 10° C./min to 15° C./min, and the first temperature is 1,000° C.; and the second heating rate is in a range of 2° C./min to 5° C./min, and the material melting temperature is in a range of 1,560° C. to 1,600° C.

* * * * *